(12) United States Patent
Liu et al.

(10) Patent No.: US 8,421,058 B2
(45) Date of Patent: Apr. 16, 2013

(54) LIGHT EMITTING DIODE STRUCTURE HAVING SUPERLATTICE WITH REDUCED ELECTRON KINETIC ENERGY THEREIN

(75) Inventors: Wei Liu, Singapore (SG); Chew Beng Soh, Singapore (SG); Soo Jin Chua, Singapore (SG); Jing Hua Teng, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 0 days.

(21) Appl. No.: 13/130,649

(22) PCT Filed: Nov. 20, 2009

(86) PCT No.: PCT/SG2009/000438
§ 371 (c)(1),
(2), (4) Date: Aug. 15, 2011

(87) PCT Pub. No.: WO2010/059132
PCT Pub. Date: May 27, 2010

(65) Prior Publication Data
US 2011/0284824 A1    Nov. 24, 2011

Related U.S. Application Data

(60) Provisional application No. 61/116,690, filed on Nov. 21, 2008.

(51) Int. Cl.
| H01L 29/06 | (2006.01) |
| H01L 31/0328 | (2006.01) |
| H01L 31/0336 | (2006.01) |
| H01L 31/072 | (2006.01) |
| H01L 31/109 | (2006.01) |

(52) U.S. Cl.
USPC ........ 257/15; 257/9; 257/14; 257/17; 257/28; 257/E29.069; 257/E29.072; 257/E29.073; 257/E29.074; 257/E29.075; 257/E29.076; 257/E29.077; 257/E29.078; 257/E31.035; 257/E31.036; 257/E33.008; 257/E33.01

(58) Field of Classification Search ................ 257/9, 14, 257/15, 17, 28, E29.069, E29.072, E29.073, 257/E29.074, E29.075, E29.076, E29.077, 257/E29.078, E31.035, E31.036, E33.008, 257/E33.009, E33.01
See application file for complete search history.

(56) References Cited

U.S. PATENT DOCUMENTS

| 4,688,068 | A | * | 8/1987 | Chaffin et al. | ................ | 136/249 |
| 5,061,970 | A | * | 10/1991 | Goronkin | ........................ | 257/22 |
| 5,198,682 | A | * | 3/1993 | Wu et al. | ........................ | 257/21 |

(Continued)

FOREIGN PATENT DOCUMENTS

| WO | 2007089360 A2 | 8/2007 |
| WO | 2008035447 A1 | 3/2008 |

*Primary Examiner* — Ida M Soward
(74) *Attorney, Agent, or Firm* — Osha Liang LLP

(57) ABSTRACT

A light emitting diode structure and a method of forming a light emitting diode structure are provided. The structure includes a superlattice comprising, a first barrier layer; a first quantum well layer comprising a first metal-nitride based material formed on the first barrier layer; a second barrier layer formed on the first quantum well layer; and a second quantum well layer including the first metal-nitride based material formed on the second barrier layer; and wherein a difference between conduction band energy of the first quantum well layer and conduction band energy of the second quantum well layer is matched to a single or multiple longitudinal optical phonon energy for reducing electron kinetic energy in the superlattice.

18 Claims, 9 Drawing Sheets

U.S. PATENT DOCUMENTS

| | | | |
|---|---|---|---|
| 5,296,720 A * | 3/1994 | Wen et al. | 257/21 |
| 5,313,073 A * | 5/1994 | Kuroda et al. | 257/18 |
| 5,352,904 A * | 10/1994 | Wen et al. | 257/21 |
| 5,473,173 A * | 12/1995 | Takiguchi et al. | 257/185 |
| 5,528,614 A * | 6/1996 | Watanabe | 372/45.01 |
| 5,548,128 A * | 8/1996 | Soref et al. | 257/18 |
| 5,561,301 A * | 10/1996 | Inoue | 257/13 |
| 5,579,331 A * | 11/1996 | Shen et al. | 372/45.011 |
| 5,627,383 A * | 5/1997 | Cunningham et al. | 257/17 |
| 5,763,896 A * | 6/1998 | Smith | 257/14 |
| 6,534,783 B1 * | 3/2003 | Wu et al. | 257/21 |
| 6,829,271 B2 * | 12/2004 | Sato et al. | 372/44.01 |
| 6,859,481 B2 * | 2/2005 | Zheng | 372/70 |
| 6,878,970 B2 * | 4/2005 | Bour et al. | 257/94 |
| 7,856,042 B2 * | 12/2010 | Botez et al. | 372/45.012 |
| 8,134,141 B2 * | 3/2012 | Krishna et al. | 257/21 |
| 2002/0096675 A1 * | 7/2002 | Cho et al. | 257/25 |
| 2005/0151154 A1 | 7/2005 | Akita et al. | |
| 2005/0194608 A1 | 9/2005 | Chen | |
| 2007/0248131 A1 * | 10/2007 | Botez et al. | 372/43.01 |
| 2008/0283818 A1 | 11/2008 | Odnoblyudov et al. | |
| 2009/0045392 A1 * | 2/2009 | Park et al. | 257/13 |
| 2010/0176369 A2 * | 7/2010 | Oliver et al. | 257/13 |
| 2012/0018701 A1 * | 1/2012 | Bergmann et al. | 257/13 |

* cited by examiner

LIGHT EMITTING DIODE STRUCTURE HAVING SUPERLATTICE WITH REDUCED ELECTRON KINETIC ENERGY THEREIN

FIELD OF INVENTION

The present invention relates broadly to a light emitting diode structure and a method of forming a light emitting diode structure.

BACKGROUND

A combination of red, green and blue light emitting diodes (LEDs) can produce white light. However, it has been noted that current white LEDs rarely use the above principle. "White" LEDs in production currently are typically modified blue LEDs i.e. Gallium Nitride (GaN)-based with Indium Gallium Nitride (InGaN)-active-layer LEDs that emit blue light having wavelengths between about 450 nm and 470 nm. Typically, the InGaN—GaN structure is covered with a yellowish phosphor coating comprising cerium-doped yttrium aluminum garnet (Ce3+:YAG) crystals which have been powdered and bound in a type of viscous adhesive. Such a LED chip emits blue light, part of which is efficiently converted to a broad-spectrum centered at about 580 nm (yellow light emission) by the Ce3+:YAG material. Since yellow light stimulates the red and green receptors of the eye, the resulting mix of blue and yellow light gives the appearance of white light, the resulting shade typically referred to as "lunar white". The pale yellow emission of the Ce3+::YAG material can be tuned by substituting the cerium with other rare earth elements such as terbium and gadolinium, and can be further adjusted by substituting some, or all, of the aluminum in the YAG with gallium.

Due to the spectral characteristics of such LEDs, one problem that can arise is that the red and green colours of objects illuminated in the blue yellow light are not as vivid as in broad-spectrum light. Further, manufacturing variations and varying thickness in the phosphor coating typically cause LEDs to produce light with different colour temperatures, e.g. ranging from yellow to cold blue. As such, disadvantageously, the resulting LEDs are required to be sorted by their actual characteristics during manufacture.

As an alternative to the above, white LEDs can be made by coating near ultraviolet emitting LEDs with a mixture of high efficiency europium-based red and blue emitting phosphors with green emitting copper and aluminum doped zinc sulfide. This method is analogous to how typical fluorescent lamps work. However, one problem is that the ultraviolet light typically causes photo-degradation to the epoxy resin of the LEDs and other materials used in LED packaging. The photo-degradation typically leads to shorter lifetimes. Further, this method is typically less energy efficient than the blue LED with YAG:Ce phosphor coating type discussed above, since the Stokes shift of this method is larger, and thus, more energy is required to be converted to heat, even if light is produced under this method with better spectral characteristics and colour rendering.

In addition to the above, existing commercial white LEDs are typically expensive and typically utilize blue LEDs coated with a layer of phosphor which results in higher production costs. Furthermore, phosphor coating typically lowers the colour rendering index of the LEDs.

Therefore, there exists a need for a light emitting diode structure and a method of forming a light emitting diode structure that seek to address at least one of the above problems.

SUMMARY

In accordance with a first aspect of the present invention, there is provided a light emitting diode structure, the structure comprising, a superlattice comprising: a first barrier layer; a first quantum well layer comprising a first metal-nitride based material formed on the first barrier layer; a second barrier layer formed on the first quantum well layer; and a second quantum well layer comprising the first metal-nitride based material formed on the second barrier layer; and wherein a difference between conduction band energy of the first quantum well layer and conduction band energy of the second quantum well layer is matched to a single or multiple optical phonon energy for reducing electron kinetic energy in the superlattice.

The superlattice may be repeatedly formed n times in the structure whereby 2<n<10.

A difference between conduction band energy of the first barrier layer and the conduction band energy of the first quantum well layer may be matched to a single or multiple optical phonon energy for reducing electron kinetic energy in the superlattice.

The second quantum well layer may be arranged to have a mole fraction of the metal element more than that of the first quantum well layer to facilitate the match of the conduction band energy difference.

The structure may further comprise an active region quantum well layer comprising a third barrier layer; an electron capture region layer comprising the first metal-nitride based material formed on the third barrier layer; a third quantum well layer comprising the first metal-nitride based material formed on the electron capture region layer, the third quantum well layer having quantum dot nanostructures embedded therein; and wherein material composition and thickness of the electron capture region layer is configured to facilitate electron capture.

The active region quantum well layer may be repeatedly formed m times in the structure whereby 1<m<5.

The structure may further comprise a p-type contact structure formed on an outermost one of the quantum well layers, the p-type contact structure comprising a p-type metal-nitride layer.

The p-type contact structure may comprise a multiple-stage doping profile.

The p-type contact structure may be doped with magnesium (Mg).

Each barrier layer may comprise a second metal-nitride based material having a different metal element compared to the first metal-nitride based material.

The first metal-nitride based material may comprise Indium-Gallium-Nitride (InGaN).

The mole fraction of Indium in the first quantum well layer may be in a range of about 0.05 to about 0.35.

The mole fraction of Indium in the second quantum well layer may be in a range of about 0.0810 to about 0.38.

The mole fraction of Indium in the third quantum well layer may be in a range of about 0.15 to about 0.45.

The mole fraction of Indium in the fourth quantum well layer may be in a range of about 0.20 to about 0.50.

The structure may be capable of emitting amber light.

The structure may further comprise one or more blue/green light emitting multiple quantum well layers whereby the structure is capable of emitting white light.

The optical phonon energy may be a longitudinal optical phonon energy.

In accordance with a second aspect of the present invention, there is provided a method of forming a light emitting diode structure, the method comprising the steps of: forming a superlattice, by forming a first barrier layer; forming a first quantum well layer on the first barrier layer, the first quantum well layer comprising a first metal-nitride based material; forming a second barrier layer on the first quantum well layer; forming a second quantum well layer on the second barrier layer, the second quantum well layer comprising the first metal-nitride based material; and wherein a difference between conduction band energy of the first quantum well layer and conduction band energy of the second quantum well layer is matched to a single or multiple optical phonon energy for reducing electron kinetic energy in the superlattice.

The method may further comprise forming the superlattice repeatedly for n times whereby 2<n<10.

A difference between conduction band energy of the first barrier layer and the conduction band energy of the first quantum well layer may be matched to a single or multiple optical phonon energy for reducing electron kinetic energy in the superlattice.

The method may further comprise forming the second quantum well layer to have a mole fraction of the metal element more than that of the first quantum well layer to facilitate the match of the conduction band energy difference.

The method may further comprise forming an active region quantum well layer, by forming a third barrier layer; forming an electron capture region layer comprising the first metal-nitride based material on the third barrier layer; forming a third quantum well layer comprising the first metal-nitride based material on the electron capture region layer, the third quantum well layer having quantum dot nanostructures embedded therein; and wherein material composition and thickness of the electron capture region layer is configured for facilitating electron capture.

The method may further comprise forming the active region quantum well layer repeatedly for m times whereby 1<m<5.

The method may further comprise forming a p-type contact structure on an outermost one of the quantum well layers, the p-type contact structure comprising a p-type metal-nitride layer.

The p-type contact structure may comprise a multiple-stage doping profile.

The structure may be capable of emitting amber light.

The method may further comprise forming one or more blue/green light emitting multiple quantum well layers whereby the structure is capable of emitting white light.

The optical phonon energy may be a longitudinal optical phonon energy.

BRIEF DESCRIPTION OF THE DRAWINGS

Embodiments of the invention will be better understood and readily apparent to one of ordinary skill in the art from the following written description, by way of example only, and in conjunction with the drawings, in which.

DETAILED DESCRIPTION

Figure 1:
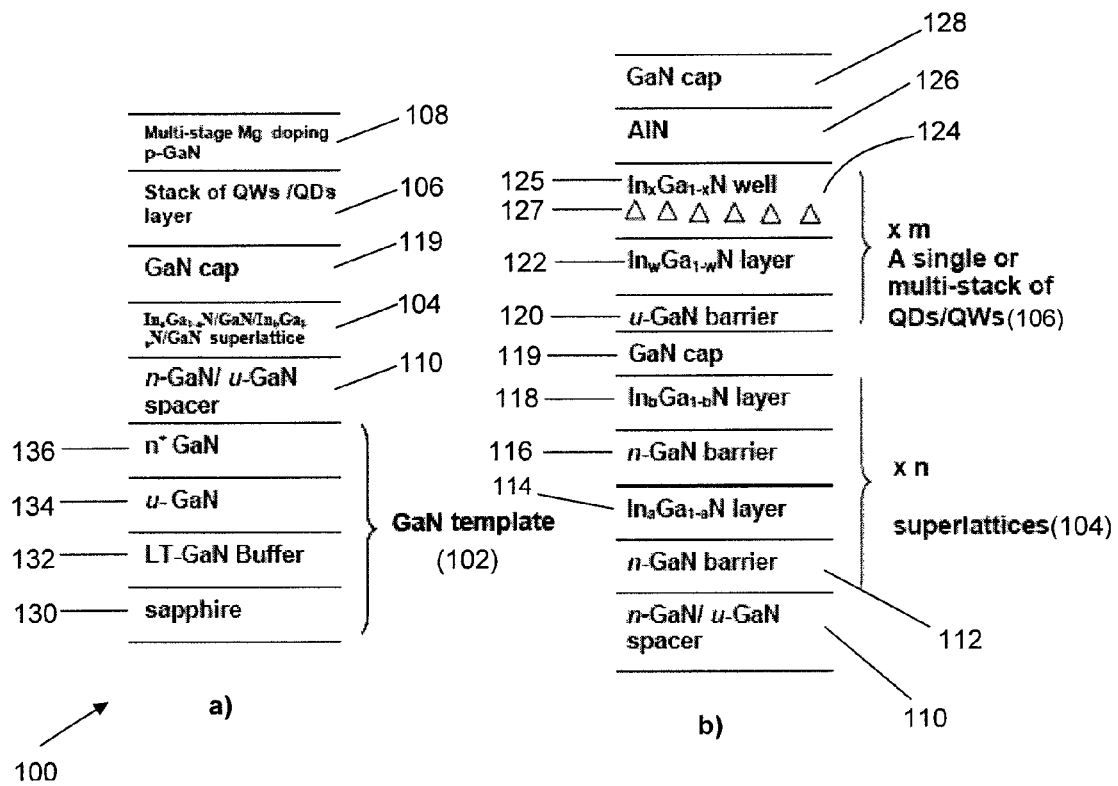
FIG. 1(a) is a schematic diagram illustrating a light emitting diode (LED) structure in an example embodiment.
FIG. 1(b) is a schematic diagram illustrating the LED structure in more detail.

Example embodiments described below can provide a structure and a method for forming a high power white LED comprising band-gap engineered InGaN/GaN quantum dots (QDs)/quantum wells (QWs) and a p-GaN layer with a multi-stage doping profile.

FIG. 1(a) is a schematic diagram illustrating a light emitting diode (LED) structure in an example embodiment. FIG. 1(b) is a schematic diagram illustrating the light emitting diode (LED) structure in more detail.

In the example embodiment, a light emitting diode structure 100 is formed using a GaN template 102. The GaN template 102 comprises a sapphire substrate 130, a low-temperature GaN buffer 132 formed on the substrate 130, a undoped u-GaN layer 134 formed on the buffer 132 and a n-doped n-GaN layer 136 formed on the u-GaN layer 134.

The LED structure 100 comprises layer 104 having one or more $In_aGa_{1-a}N/GaN/In_bGa_{1-b}N/GaN$ superlattices; layer 106 having a single or multiple stacks of QDs/QWs structures; and a p-GaN epilayer 108 with a multi-stage Magnesium (Mg) doping profile.

In the example embodiment, a GaN spacer layer 110 is formed on the GaN template 102. The $In_aGa_{1-a}N/GaN/In_bGa_{1-b}N/GaN$ superlattices structure layer 104 is added after the growth of the GaN spacer layer 110. The superlattices structure layer 104 comprises a first quantum well layer $In_aGa_{1-a}N$ and a second quantum well layer $In_bGa_{1-b}N$. In the example embodiment, the superlattices structure layer 104 can be repeated n times where 2<n<10. The purpose of the superlattices structure layer 104 is to slow down fast moving electrons through thermalisation and increase dwell time of electrons in the active region layer, e.g. the layer 106, by band-gap engineering.

The $In_aGa_{1-a}N/GaN/In_bGa_{1-b}N/GaN$ superlattices structure layer 104 is designed such that conduction band energy difference (i.e. conduction band offset), or the first quantized energy level of the superlattice comprising GaN 112 and $In_aGa_{1-a}N$ 114, and GaN 116 and $In_bGa_{1-b}N$ 118, is matched to a single or multiple optical phonon energy, preferably longitudinal optical phonon energy.

Figure 9:
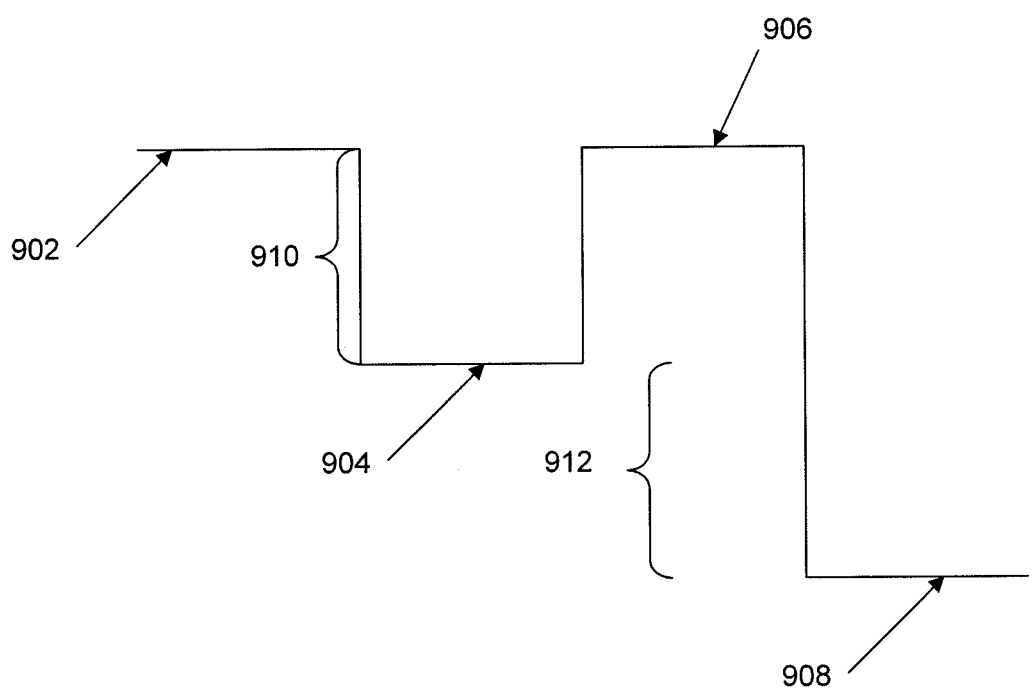
FIG. 9 is a schematic energy diagram illustrating band-gap engineering in an example embodiment.

FIG. 9 is a schematic energy diagram illustrating band-gap engineering in the example embodiment. Numeral 902 shows the conduction band energy of GaN 112 (FIG. 1), numeral 904 shows the conduction band energy of $In_aGa_{1-a}N$ 114 (FIG. 1), numeral 906 shows the conduction band energy of GaN 116 (FIG. 1) and numeral 908 shows the conduction band energy of $In_bGa_{1-b}N$ 118 (FIG. 1). In the example embodiment, by matching a difference between the conduction band energy 904 of $In_aGa_{1-a}N$ 114 (FIG. 1) and the conduction band energy 908 of $In_bGa_{1-b}N$ 118 (FIG. 1), ie. the difference indicated at numeral 912, to a single or multiple optical phonon energy, electron kinetic energy is reduced through emission of for example longitudinal optical phonons with a phonon energy of about 0.092 eV.

Preferably, a difference between the conduction band energy 902 of GaN 112 (FIG. 1) and the conduction band energy 904 of $In_aGa_{1-a}N$ 114 (FIG. 1), ie. see numeral 910, is also matched to a single or multiple optical phonon energy such that electron kinetic energy is reduced through emission of for example longitudinal optical phonons.

Returning to FIGS. 1(*a*) and (*b*), the GaN 116 is kept thin, ie. about 3 to 20 nm, to facilitate electron tunneling, and promoted due to the band-gap engineering described above. Therefore, the above design is effective in reducing the electron kinetic energy through emission of e.g. longitudinal optical phonons. Thus, when electrons pass through the superlattices structure layer 104, they begin to move at a slower speed before they enter into the active region e.g. the layer 106, thus, providing a higher probability of recombination. In this way, recombination efficiency or carrier injection efficiency and internal quantum efficiency of the LED structure 100 is increased.

After formation of the superlattices structure layer 104, a GaN cap layer 119 is formed.

In the example embodiment, the single or multi-stack InGaN QDs/QWs structure layer 106 emitting in a longer wavelength (than e.g. blue/green), e.g. yellow, amber and red, is formed on the GaN cap layer 119. In the example embodiment, the InGaN QDs/QWs structure layer 106 can be repeated m times where 1<m<5. To form the InGaN QDs/QWs structure layer 106, a u-GaN barrier layer 120 is formed. After growth of the u-GaN barrier layer 120, a $In_wGa_{1-w}N$ layer 122 with a low indium mole fraction is grown. $In_xGa_{1-x}N$ QDs/QWs 124 are grown on the $In_wGa_{1-w}N$ layer 122. The $In_wGa_{1-w}N$ layer 122 serves as an electron capture region before electrons transit to the $In_xGa_{1-x}N$ QDs/QWs 124 for radiative recombination to give yellow, amber or red emission. In the example embodiment, the $In_wGa_{1-w}N$ layer 122 also functions as a wetting layer to enhance the incorporation of Indium nitride quantum dots during an In burst process. The $In_xGa_{1-x}N$ QDs/QWs 124 is a $In_xGa_{1-x}N$ quantum well layer 125 having quantum dot nanostructures or quantum dots 127 embedded therein. By engineering the indium composition and thickness of this $In_wGa_{1-w}N$ layer 122, carrier capture efficiency is increased. That is, energy potential can be lowered and the electrons can be further slowed down in the $In_wGa_{1-w}N$ layer 122 before entering $In_xGa_{1-x}N$ QDs/QWs 124. The $In_wGa_{1-w}N$ layer 122 is preferably maintained at a thickness range from about 3 to 20 nm, and preferably a thickness of about 7 nm for optimum carrier capture efficiency. It has been recognised by the inventors that if the $In_wGa_{1-w}N$ layer 122 is too thick (e.g. more than 20 nm), the material quality and formation of the quantum dot nanostructures may be adversely affected.

After forming the InGaN QDs/QWs structure layer 106, a AlN layer 126 and a GaN cap layer 128 are formed.

In the example embodiment, the p-contact layer or p-GaN epilayer 108 having a multiple-stage Mg doping profile is formed on the GaN cap layer 128. A Biscyclopentadienilmagnesium ($Cp_2Mg$) precursor is used as the p-dopant for the p GaN epilayer 108. The doping concentration is varied in steps from the bottom of the epilayer 108 to the top by changing the $Cp_2Mg$ flow rate or a Trimethylgallium (TMGa) flow rate.

Secondary ion mass spectrometry (SIMS) depth profiling is carried out on one sample of the example embodiment comprising an epilayer with a multiple stage Mg doping profile to determine composition distribution of the different elements, namely Gallium (Ga), Magnesium (Mg), Nitrogen (N) and Indium (In) with depth, based on their atomic weight. As a comparison, the Mg dopant in a conventional uniformly-doped p-GaN layer used in a conventional LED is also measured using SIMS.

Figure 2:
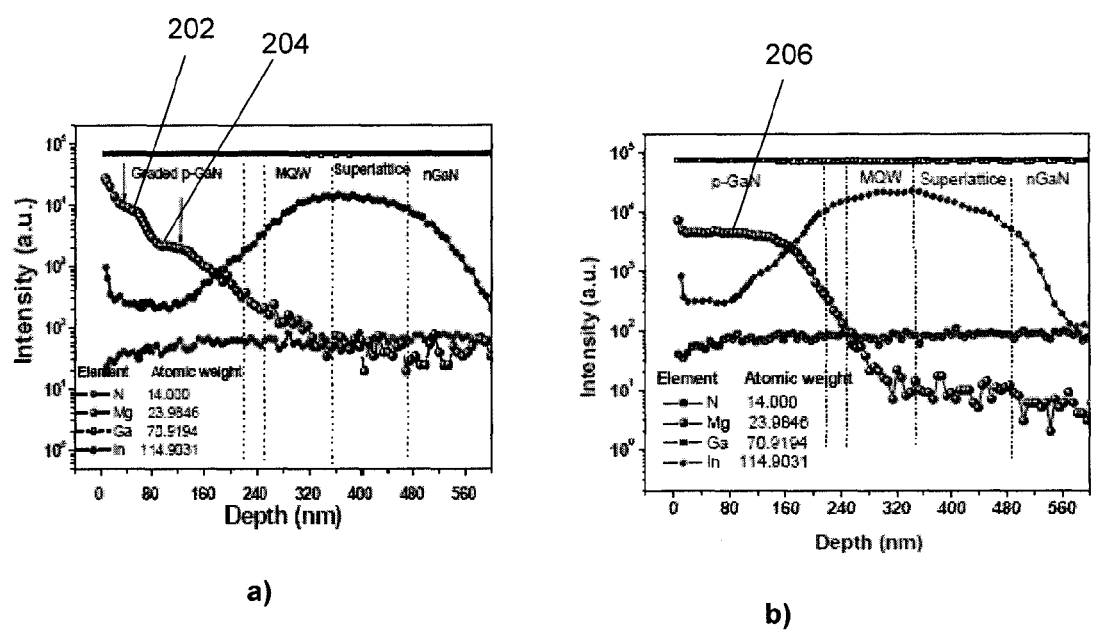
FIG. 2(a) shows a secondary ion mass spectrometry (SIMS) depth profile of a LED sample of an example embodiment comprising a p-GaN epilayer with multiple-stage doping of about $7\times10^{17}$ cm$^{-3}$ at a first stage, about $2\times10^{18}$ cm$^{-3}$ at a second stage and about $7\times10^{18}$ cm$^{-3}$ at a third stage.
FIG. 2(b) shows a SIMS depth profile of a conventional LED with a uniformly type doped GaN epilayer having a constant doping of concentration of about $2\times10^{18}$ cm$^{-3}$.

FIG. 2(*a*) shows a SIMS depth profile of the LED sample of the example embodiment comprising a p-GaN epilayer with multiple-stage doping of about $7 \times 10^{17}$ cm$^{-3}$ at a first stage, about $2 \times 10^{18}$ cm$^{-3}$ at a second stage and about $7 \times 10^{18}$ cm$^{-3}$ at a third stage. FIG. 2(*b*) shows a SIMS depth profile of the conventional LED with a uniformly type doped GaN epilayer having a constant doping of concentration of about $2 \times 10^{18}$ cm$^{-3}$. As shown in FIG. 2(*a*), there is a step like profile (see numerals 202, 204) in the Mg distribution of the sample of the example embodiment. The Mg composition is estimated to be about $7 \times 10^{17}$ cm$^{-3}$ at the interface with the GaN cap layer (compare cap layer 128 in FIG. 1(*a*)) after the growth of the stacked QDs/QWs. The p-doping is then increased in steps to about $2 \times 10^{18}$ cm$^{-3}$ and subsequently to about $7 \times 10^{18}$ cm$^{-3}$ at the top of the epilayer (compare epilayer 108 in FIG. 1(*a*)), which is intended to contact a transparent Ni/Au electrode. On the contrary, Mg concentration is shown to be substantially constant (see numeral 206) across the whole p-contact layer in the conventional uniformly-doped p-GaN as shown in FIG. 2(*b*).

The inventors have recognised that in a conventional highly doped p-contact layer with a constant concentration, while desired for forming an ohmic contact, a highly doped p-contact layer is likely to cause diffusion of the dopant into the active regions of a LED structure. Further, a highly doped p-contact layer is likely to cause hole mobility to be lowered.

On the other hand, a p-GaN epilayer with multiple-stage doping of the sample of the example embodiment can address the above problems. The concentration of the dopant of the epilayer at the metal contact interface is controlled to be higher relative to other areas of the epilayer while the concentration of the dopant of the epilayer nearer to the active regions (compare layer 106 of FIG. 1(*a*)) is controlled to be lower. Therefore, a good ohmic contact can be formed with the metal contact while diffusion of the dopant into the active regions can be lowered. Furthermore, as the doping nearer to the active regions is lower, hole mobility is likely to be high. This can encourage holes to travel deeper into the active regions and thus, result in a higher electron-hole recombination volume.

Furthermore, thickness of the multi-step p-type doping contact layer or epilayer of the sample of the example embodiment can be grown thicker than the conventional one-step p-contact layer to facilitate surface patterning such that light extraction is advantageously enhanced.

In an example embodiment, growth of a white light emitting diode (LED) is performed using a metalorganic chemical vapour deposition system.

Trimethylgallium (TMGa), TrimethylIndium (TMIn), Trimethylaluminium (TMA), Biscyclopentadienilmagnesium ($Cp_2Mg$) and silane ($SiH_4$) are used as the precursors. Hydrogen and nitrogen are used as the carrier gas for effective incorporation of the relevant elements on the LED surfaces.

Figure 3:
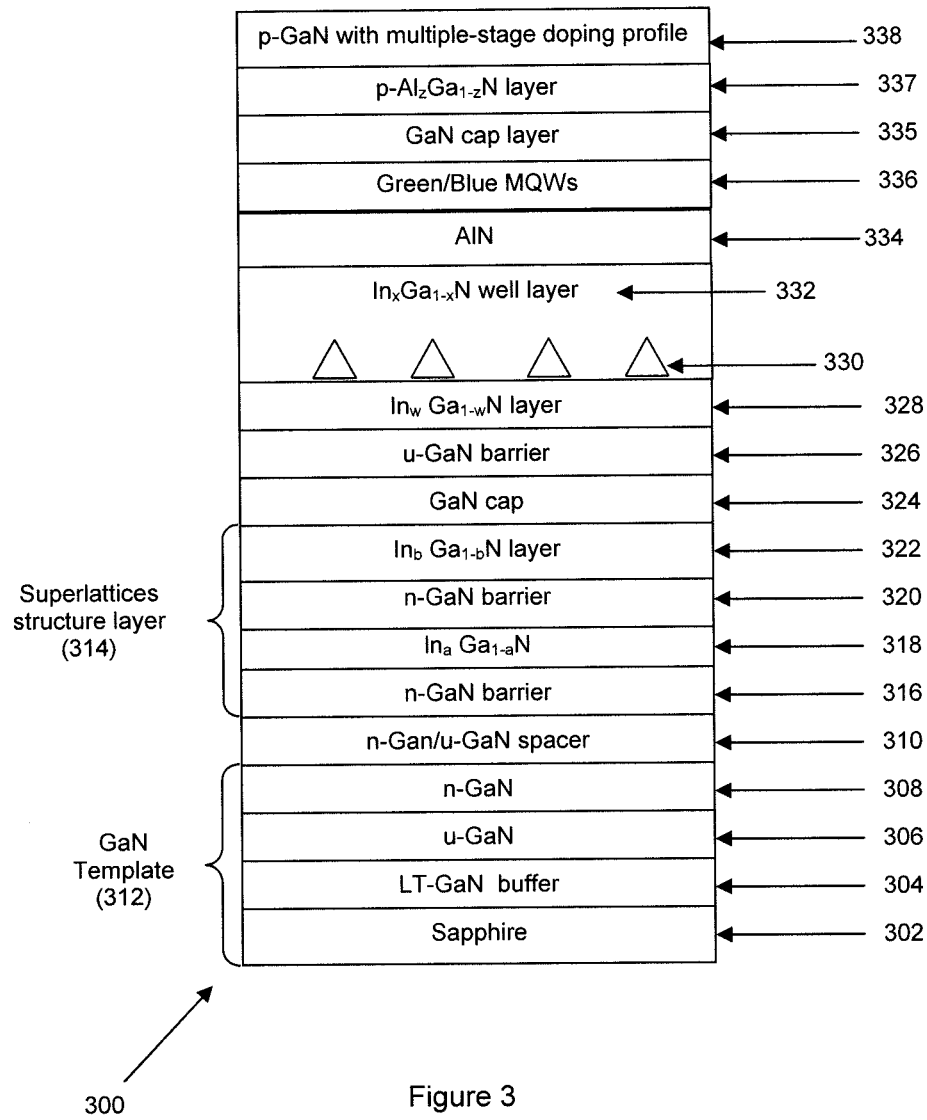
FIG. 3 is a schematic diagram illustrating a LED structure in an example embodiment.

FIG. 3 is a schematic diagram illustrating a light emitting diode (LED) structure 300 in an example embodiment.

In the example embodiment, a sapphire substrate 302 is provided. A low temperature GaN buffer 304 is grown in the range of about 520° C. to about 550° C. for a thickness of about 25 nm to facilitate nucleation of GaN on the sapphire substrate 302. Subsequently, a high temperature undoped GaN layer 306 is grown to a thickness of about 2 μm at about 1020° C. to about 1030° C. on the GaN buffer 304. A highly silicon-doped GaN layer 308 with a thickness of about 2-2.5 μm and having a concentration in the range of about $1\times10^{18}$ to about $9\times10^{18}$ cm$^{-3}$ is then formed on the undoped GaN layer 306. A spacer layer 310 of n-GaN (ie. Si with concentration of less than about $5\times10^{17}$ cm$^{-3}$), or of undoped GaN, is grown on the GaN layer 308. N-type doping is achieved using SiH$_4$. The spacer layer 310 is grown at a temperature of between about 800° C. to about 900° C. with a thickness in the range of about 50 to about 200 nm. In the example embodiment, the sapphire substrate 302 and the various layers 304, 306 and 308 are collectively termed as a GaN template 312.

After formation of the GaN template 312 and the spacer layer 310, growth of a $In_aGa_{1-a}N/GaN/In_bGa_{1-b}N$ superlattices carrier thermalisation layer 314 is described.

A n-GaN barrier 316 (with Si doping of n of about $2\times10^{17}$ to about $1\times10^{18}$ cm$^{-3}$) having a thickness between about 3 to about 20 nm is grown at a temperature of about 750° C. to about 900° C. The thickness of the barrier 316 is preferably below about 5 nm to enable carrier tunneling. The temperature is then lowered to a temperature of about 760° C. to about 800° C. to grow a $In_aGa_{1-a}N$ layer 318 (where $0.05<a<0.35$) with a thickness of about 2 to about 10 nm. A GaN barrier 320 of between about 3 to about 20 nm thick is then added at a temperature of about 750° C. to about 900° C. A $In_bGa_{1-b}N$ layer 322 (having $0.0810<b<0.38$, where $b>a$) having a thickness of about 2 to about 10 nm is formed in the temperature range of about 730° C. to about 790° C. on the GaN barrier 320. The relationship $b>a$ is chosen such that the conduction band energy difference (i.e. conduction band offset) of the superlattices carrier thermalisation layer 314 is matched to a single or multiple longitudinal optical phonon energy, as described above with reference to FIG. 9. The TMIn flow rate for growth of the $In_bGa_{1-b}N$ layer 322 is higher than that used for the $In_aGa_{1-a}N$ layer 318. In the example embodiment, these four layers 316, 318, 320, 322, GaN/$In_aGa_{1-a}N$/GaN/$In_bGa_{1-b}N$, are repeated for a period n (where $2<n<10$). Only one set is shown in FIG. 3 for illustration. Compare with superlattices structure layer 104 of FIG. 1(b).

After forming the last $In_bGa_{1-b}N$ layer 322 (over the period n), an undoped GaN cap layer 324 is then grown on top of the superlattice layer 314 at a temperature of about 750° C. to about 900° C. The GaN cap layer 324 has a thickness of between about 3 to about 20. The thickness of the barrier 324 is preferably below about 5 nm to enable carrier tunneling.

After formation of the superlattices layer 314 and the GaN cap layer 324, growth of InGaN QDs/QWs with a $In_wGa_{1-w}N$ carrier capture layer to generate emission in the longer wavelength range is described.

A u-GaN barrier 326 is grown on the GaN cap layer 324 at a temperature of about 750° C. to about 900° C. to a thickness of between about 3 to about 20 nm. The temperature is then lowered to a temperature range of about 750° C.-810° C. for the growth of an $In_wGa_{1-w}N$ layer 328 (where $0.15\leq w\leq 0.45$) for a thickness of about 3 to about 20 nm. After the growth of the $In_wGa_{1-w}N$ layer 328, TMGa flow is set to zero for TMIn treatment to grow InGaN QDs e.g. 330 for a time duration from about 6 s to about 30 s. The TMIn flow is set in the range of about 5.0 to about 100 μmol/min and the growth temperature is in the range of about 700-760° C. The growth conditions can determine the size and composition of Indium in the InGaN QDs e.g. 330.

After the growth of the InGaN QDs e.g. 330, a $In_xGa_{1-x}N$ QW layer 332 (where $0.20\leq x\leq 0.50$) is grown at the same temperature above. The amount of indium incorporation determines the colour of emission. In the example embodiment, the u-GaN barrier 326, the $In_wGa_{1-w}N$ layer 328, the InGaN QDs e.g. 330 and the $In_xGa_{1-x}N$ QW layer 332 are repeated for a period m (where $1<m<5$). Only one set is shown in FIG. 3 for illustration. Compare with layer 106 of FIG. 1(b).

The individual quantum wells of layer 332 are capped with a AlN layer 334 which prevents diffusion of the In rich InGaN QDs e.g. 330 to the quantum wells of layer 332, or, into the GaN barrier layer 326. The AlN layer 334 is kept thin compared to the well layer 332 (preferably below about 3 nm). It is noted that after the growth of the InGaN well layer 332, sufficient time of e.g. about 30 seconds is provided for Indium and Gallium adatoms migration before the growth of the AlN layer 334. The growth temperature of the AlN layer 334 is set at about 10 to about 1000° C. higher than the growth of the InGaN well layer 332 to obtain better crystal quality.

At this stage, the structure 300 up to AlN layer 334 can be used as an amber-orange LED, provided that top contact structures are formed.

Figure 4:
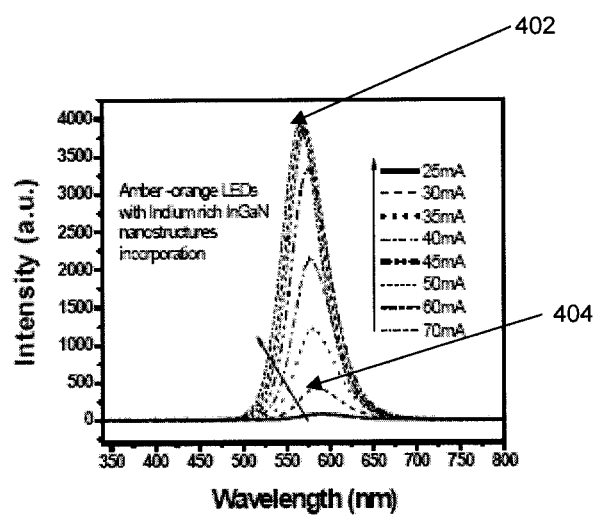
FIG. 4 shows an electroluminescence spectra under varying injection currents of an amber-orange LED sample formed according to the example embodiment.

FIG. 4 shows an electroluminescence spectra under varying injection currents of an amber-orange LED sample formed according to the example embodiment. It can be observed that the intensity or light power output increases substantially linearly with an increase in injection current. Further, it can be observed that the peak wavelengths (see e.g. 402, 404) remain substantially constant which implies that the colour emitted remains substantially constant with increasing injection current.

Returning to FIG. 3, growth of a green or blue InGaN/GaN multiple quantum wells (MQWs) layer 336 for color tuning, e.g. to obtain a white LED, can be performed. A green or blue or a stack of both green and blue color MQWs can be grown on the AlN layer 334.

Figure 5:
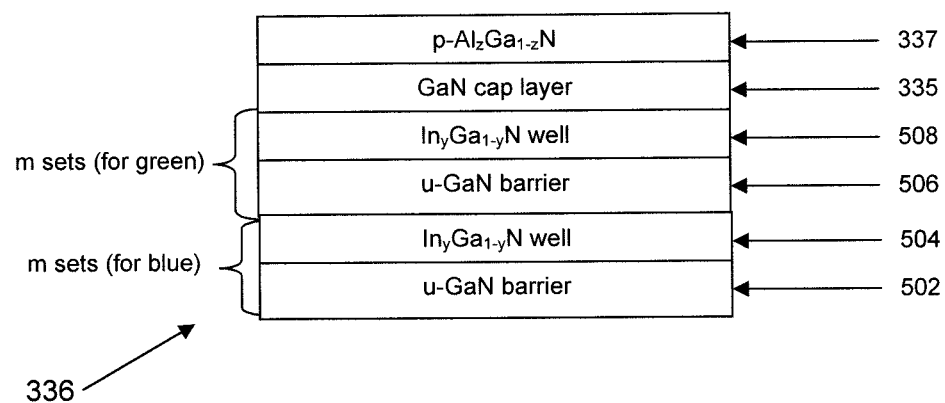
FIG. 5 is a schematic diagram illustrating an InGaN/GaN multiple quantum wells (MQWs) layer of FIG. 3 in more detail.

FIG. 5 is a schematic diagram illustrating the InGaN/GaN MQWs layer 336 of FIG. 3 in more detail. To form blue emitting MQWs, a GaN layer 502 of about 7 to about 20 nm thick is first grown at a temperature of about 750° C. to about 900° C. The temperature is then lowered to between about 760° C. to about 800° C. for growth of a $In_yGa_{1-y}N$ well 504 (where $0.15<y<0.25$) and having a thickness of about 2 to about 5 nm. The quantum wells 502-504 are repeated for a period of m (where $1<m<5$). Only one set is shown in FIG. 5 for illustration.

To form green emitting MQWs, a GaN layer 506 of about 7 to about 20 nm thick is first grown at a temperature of about 750° C. to about 900° C. A $In_yGa_{1-y}N$ well 508 (where $0.30<y<0.40$) is then grown at a temperature range of between about 740° C. to about 780° C. and having a thickness of about 2 to about 5 nm. The quantum wells 506-508 are repeated for a period of m (where $1<m<5$). Only one set is shown in FIG. 5 for illustration.

After growth of a desired set of MQWs e.g. 502-508, a thin GaN cap layer 335 is grown to a thickness of about 15 to about 30 nm at about 780° C. to about 900° C. Compare layer 128 of FIG. 1(b). Preferably, an electron blocking layer 337 of p-$Al_zGa_{1-z}N$ (where $0.1<z<0.3$) is then grown to a thickness of about 20 to about 50 nm. The TMA flow rate for the growth of the p-$Al_zGa_{1-z}N$ layer 337 is kept at between about 40 to about 100 μmol/min with a growth temperature of about 780° C. to about 900° C. The Cp$_2$Mg source is kept at a rate of about 0.3 to about 1.8 μmol/min during growth. This layer 337 serves to block electrons from directly traversing to a subsequent p-GaN region (see numeral 338 of FIG. 3) hence enabling effective recombination at the MQWs e.g. 502-508.

Returning to FIG. 3, a p-GaN layer 338 with a multiple-stage doping profile is formed to contact with an electrode (not shown). In the example embodiment, the dopant used is Mg.

Figure 6:
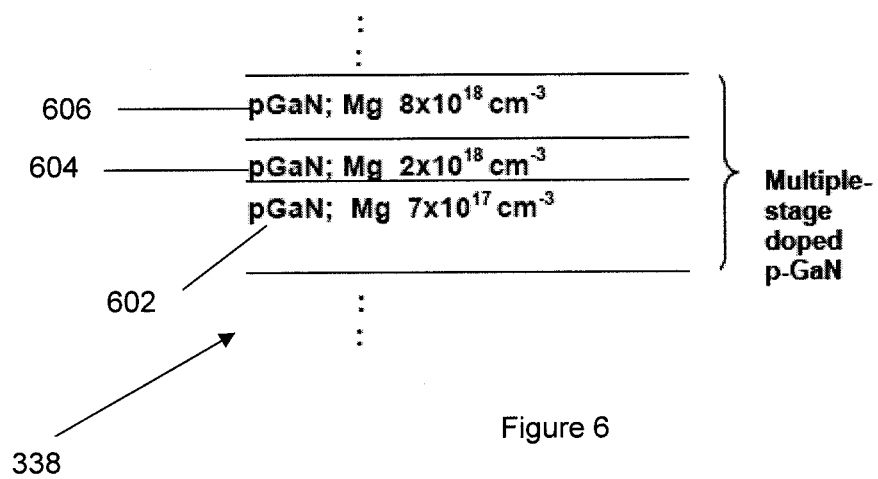
FIG. 6 is a schematic diagram illustrating a p-GaN layer of FIG. 3 in more detail.

FIG. 6 is a schematic diagram illustrating the p-GaN layer 338 of FIG. 3 in more detail. To form layer 338, the temperature is maintained at about 780° C. to about 950° C. Three or more growth steps for the p-GaN 338 can be adopted. For example, in the example embodiment, in the 1st step layer 602 of p-GaN (about 50 to about 100 nm thick), a lower Mg doping, in the range of about $10^{17}$ to about $10^{18}$ cm$^{-3}$ is used. For the 2nd step layer 604 of p-GaN (about 50 to about 100 nm thick), a Mg doping of about $10^{18}$ to about $5 \times 10^{18}$ cm$^{-3}$ is used. For the 3$^{rd}$ layer 606, ie. close to the Ni/Au contact of an electrode (not shown), the doping concentration is increased to between about $5 \times 10^{18}$ to about $10^{19}$ cm$^{-3}$, by increasing the Cp$_2$Mg flow.

Figure 7:
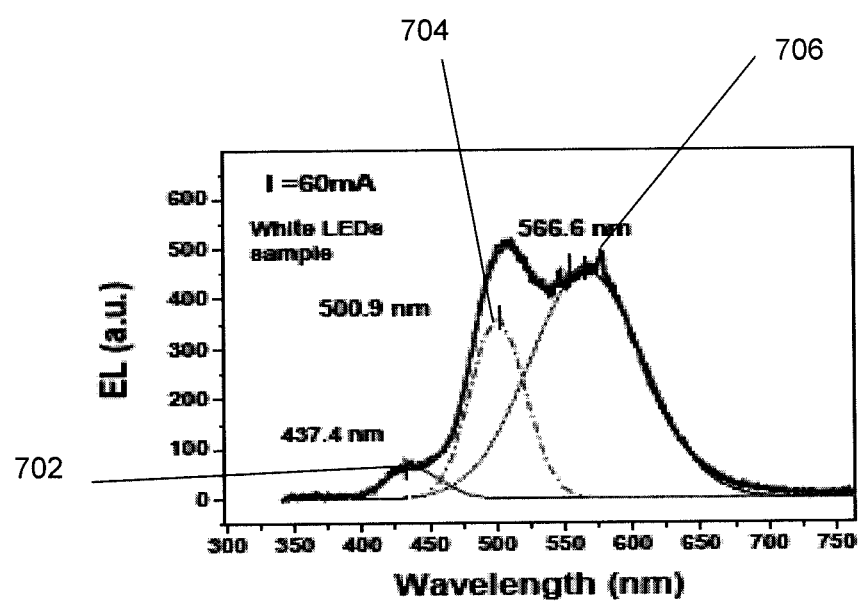
FIG. 7 shows an electroluminescence spectrum for a white LED sample formed according to the example embodiment.

A sample white LED is fabricated using the example embodiment. It is found that strong white emission is obtained with Indium contact placed on the p-GaN epilayer and n+−GaN layer. FIG. 7 shows an electroluminescence spectrum for the white LED. Using an injection current of about 60 mA, it can be observed that there are the three emission peaks at about 437.4 nm (blue light) at numeral 702, about 500.9 nm (green light) at numeral 704 and about 566.6 nm (yellow light) at numeral 706 based on fitting. Different shades of white emission can be obtained with a combination of stacked QDs/QWs (compare 106 of FIG. 1(*a*)) and blue and/or green emission QWs.

Another sample LED is fabricated and packaged based on the above example embodiment, using the three components of interest, ie. In$_a$Ga$_{1-a}$N/GaN/In$_b$Ga$_{1-b}$N/GaN superlattices; a single or multiple stacks of QDs/QWs structures; and p-GaN epilayer with multi-stage doping profile. It is found that the sample LED can display a cool white color emission with a luminous efficiency LE=15.9 lm/N at about 30 mA.

Yet another sample LED is fabricated and packaged based on the above example embodiment, using the three components of interest, ie. In$_a$Ga$_{1-a}$N/GaN/In$_b$Ga$_{1-b}$N/GaN superlattices; a single or multiple stacks of QDs/QWs structures; and p-GaN epilayer with multi-stage doping profile. It is found that the sample LED can display a warm white color emission with a luminous efficiency LE=43.5 lm/W at about 30 mA.

Figure 8:
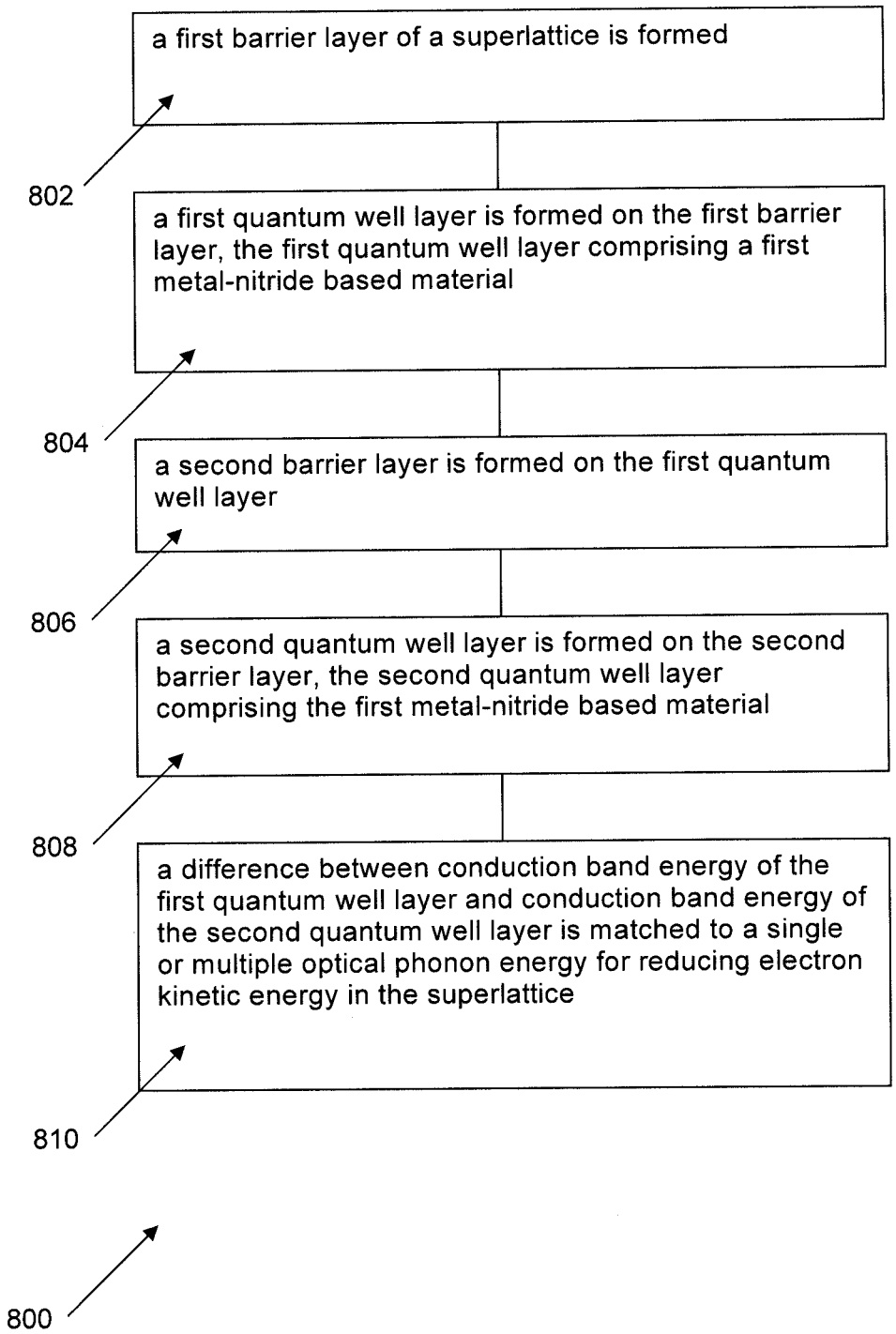
FIG. 8 is a flowchart illustrating a method of forming a light emitting diode structure in an example embodiment.

FIG. 8 is a flowchart 800 illustrating a method of forming a light emitting diode structure in an example embodiment. At step 802, a first barrier layer of a superlattice is formed. At step 804, a first quantum well layer is formed on the first barrier layer, the first quantum well layer comprising a first metal-nitride based material. At step 806, a second barrier layer is formed on the first quantum well layer. At step 808, a second quantum well layer is formed on the second barrier layer, the second quantum well layer comprising the first metal-nitride based material. At step 810, a difference between conduction band energy of the first quantum well layer and conduction band energy of the second quantum well layer is matched to a single or multiple optical phonon energy for reducing electron kinetic energy in the superlattice.

The above described example embodiments can increase carrier injection efficiency. The above described example embodiments can increase carrier capture efficiency. The above described example embodiments can increase electron-hole recombination volume and thus increase internal quantum efficiency. The above described example embodiments can increase power output of InGaN quantum dots-based LEDs.

In the example embodiments, the material used include GaN and InGaN. However, it will be appreciated that the material are not limited to the above and can include any different metal-nitride based material.

It will be appreciated by a person skilled in the art that numerous variations and/or modifications may be made to the present invention as shown in the specific embodiments without departing from the spirit or scope of the invention as broadly described. The present embodiments are, therefore, to be considered in all respects to be illustrative and not restrictive.

The invention claimed is:

1. A light emitting diode structure, the structure comprising,
   an active region comprising an electron capture region layer;
   a superlattice comprising:
      a first barrier layer;
      a first quantum well layer comprising a first metal-nitride based material formed on the first barrier layer;
      a second barrier layer formed on the first quantum well layer; and
      a second quantum well layer comprising the first metal-nitride based material formed on the second barrier layer; and
   wherein a difference between conduction band energy of the first quantum well layer and conduction band energy of the second quantum well layer is matched to a single or multiple optical phonon energy for reducing electron kinetic energy in the superlattice prior to an electron entering the electron capture region layer.

2. The structure as claimed in claim 1, wherein the superlattice is repeatedly formed n times in the structure whereby 2<n<10.

3. The structure as claimed in claim 1, wherein a difference between conduction band energy of the first barrier layer and the conduction band energy of the first quantum well layer is matched to a single or multiple optical phonon energy for reducing electron kinetic energy in the superlattice.

4. The structure as claimed in claim 1, wherein the second quantum well layer is arranged to have a mole fraction of the metal element more than that of the first quantum well layer to facilitate the match of the conduction band energy difference.

5. The structure as claimed in claim 1, the active region comprising:
   a third barrier layer;
   the electron capture region layer comprising the first metal-nitride based material formed on the third barrier layer;
   a third quantum well layer comprising the first metal-nitride based material formed on the electron capture region layer, the third quantum well layer having quantum dot nanostructures embedded therein; and
   wherein material composition and thickness of the electron capture region layer is configured to facilitate electron capture.

6. The structure as claimed in claim 5, wherein the active region is repeatedly formed m times in the structure whereby 1<m<5.

7. The structure as claimed in claim 1, further comprising a p-type contact structure formed on an outermost one of the quantum well layers, the p-type contact structure comprising a p-type metal-nitride layer.

8. The structure as claimed in claim 7, wherein the p-type contact structure comprises a multiple-stage doping profile.

9. The structure as claimed in claim 8, wherein the p-type contact structure is doped with magnesium (Mg).

10. The structure as claimed in claim 1, wherein each barrier layer comprises a second metal-nitride based material having a different metal element compared to the first metal-nitride based material.

11. The structure as claimed in claim 5, wherein the first metal-nitride based material comprises Indium-Gallium-Nitride (InGaN).

12. The structure as claimed in claim 11, wherein the mole fraction of Indium in the first quantum well layer is in a range of about 0.05 to about 0.35.

13. The structure as claimed in claim 11, wherein the mole fraction of Indium in the second quantum well layer is in a range of about 0.0810 to about 0.38.

14. The structure as claimed in claim 11, wherein the mole fraction of Indium in the electron capture region layer is in a range of about 0.15 to about 0.45.

15. The structure as claimed in claim 11, wherein the mole fraction of Indium in the third quantum well layer is in a range of about 0.20 to about 0.50.

16. The structure as claimed in claim 3, wherein the structure is capable of emitting amber light.

17. The structure as claimed in claim 3, the structure further comprising one or more blue/green light emitting multiple quantum well layers whereby the structure is capable of emitting white light.

18. The structure as claimed in claim 1, wherein the optical phonon energy is a longitudinal optical phonon energy.

* * * * *